(12) United States Patent
Angelucci

(10) Patent No.: US 8,670,879 B1
(45) Date of Patent: Mar. 11, 2014

(54) AUTOMATICALLY EJECTING FLIGHT DATA RECORDER

(75) Inventor: Marc T. Angelucci, Cherry Hill, NJ (US)

(73) Assignee: Lockheed Martin Corporation, Bethesda, MD (US)

(*) Notice: Subject to any disclaimer, the term of this patent is extended or adjusted under 35 U.S.C. 154(b) by 189 days.

(21) Appl. No.: 12/868,867

(22) Filed: Aug. 26, 2010

Related U.S. Application Data

(63) Continuation-in-part of application No. 12/764,374, filed on Apr. 21, 2010, now Pat. No. 8,493,715.

(51) Int. Cl.
*B64D 45/00* (2006.01)

(52) U.S. Cl.
USPC .......... 701/14; 361/679.01; 312/223.1; 244/1 R

(58) Field of Classification Search
USPC ......... 244/1 R; 701/14, 35; 312/223.2, 223.3; 361/679.01
See application file for complete search history.

(56) References Cited

U.S. PATENT DOCUMENTS

| | | | | |
|---|---|---|---|---|
| 2,687,541 A * | 8/1954 | Bannister | ............................ | 441/9 |
| 2,825,803 A * | 3/1958 | Newbrough | ..................... | 455/96 |
| 2,959,671 A * | 11/1960 | Stevinson | ........................ | 455/96 |
| 3,140,847 A * | 7/1964 | Ames, Jr. | ................... | 244/138 R |
| 3,157,890 A * | 11/1964 | Mellon, Jr. et al. | ................ | 441/9 |
| 3,181,809 A * | 5/1965 | Lobelle | ........................... | 244/1 R |
| 3,583,657 A * | 6/1971 | Boyce | ............................ | 244/1 R |
| 3,584,581 A * | 6/1971 | Flatau et al. | .................... | 102/387 |
| 3,978,410 A * | 8/1976 | Fletcher et al. | ................. | 455/96 |
| 4,664,281 A * | 5/1987 | Falk et al. | ........................ | 220/3.8 |
| 4,694,119 A * | 9/1987 | Groenewegen | ................. | 174/521 |
| 4,944,401 A * | 7/1990 | Groenewegen | ................. | 206/521 |
| 5,508,922 A * | 4/1996 | Clavelloux et al. | .............. | 701/14 |
| 5,708,565 A * | 1/1998 | Fairbanks | ....................... | 361/704 |
| 5,859,765 A * | 1/1999 | Grewe | ........................... | 361/724 |
| 6,040,526 A * | 3/2000 | Olzak | ............................ | 174/544 |
| 6,153,720 A * | 11/2000 | Olzak et al. | .................... | 528/182 |
| 6,260,508 B1 * | 7/2001 | Morse | ............................ | 116/211 |
| D470,450 S * | 2/2003 | Olzak | ........................... | D12/400 |
| 6,684,569 B2 * | 2/2004 | Gineris et al. | ................... | 49/379 |
| 6,895,314 B2 * | 5/2005 | Ailor et al. | ....................... | 701/13 |
| 7,027,719 B1 * | 4/2006 | Schneider et al. | ............. | 386/224 |
| 7,208,685 B2 * | 4/2007 | Browning et al. | ............. | 174/544 |
| 7,333,343 B2 * | 2/2008 | Olzak | ........................... | 361/724 |
| 7,618,009 B2 | 11/2009 | Glockler | | |
| 2005/0236521 A1 | 10/2005 | Krause et al. | | |
| 2009/0112381 A1* | 4/2009 | Schwinn et al. | ................. | 701/14 |

FOREIGN PATENT DOCUMENTS

GB  2228458 A  *  8/1990  ............. B64D 25/00

OTHER PUBLICATIONS

U.S. Appl. No. 12/764,374, filed in the United States Patent and Trademark Office Apr. 21, 2010 in the name of Marc T. Angelucci.

* cited by examiner

*Primary Examiner* — Benjamin P Lee

(74) *Attorney, Agent, or Firm* — Howard IP Law Group, PC

(57) ABSTRACT

An apparatus for holding a flight data recorder in an aircraft includes a housing that defines a compartment enclosing the flight data recorder and a flotation device encapsulating the flight data recorder. If the aircraft crashes into a body of water and become submerged, one or more releasable fasteners holding the compartment's cover in place are triggered thereby removing the cover over an opening in the compartment and ejecting the flotation device and the flight data recorder out of the compartment. The floatation device then floats the flight data recorder to the surface of the water where it can be located by the rescuers.

16 Claims, 7 Drawing Sheets

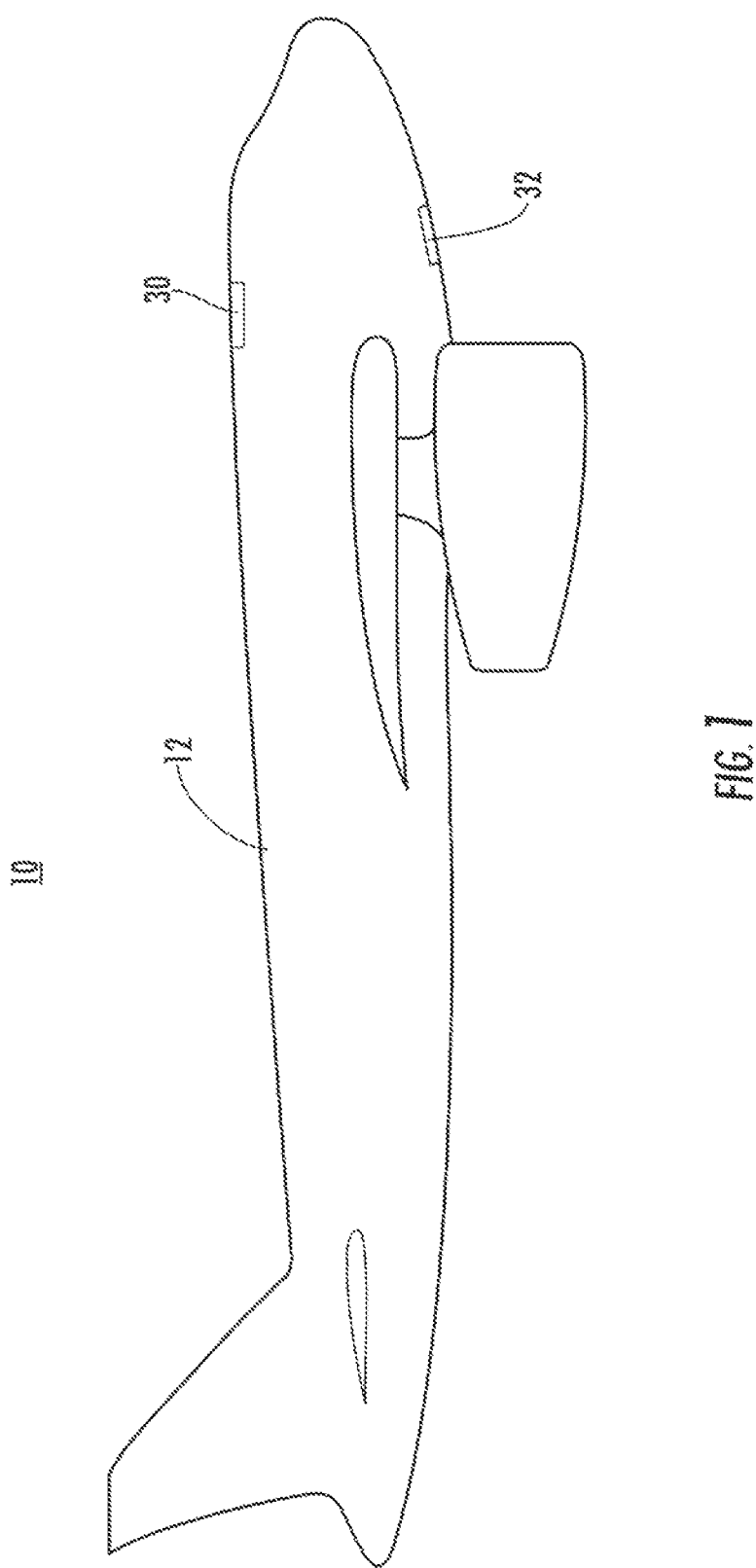

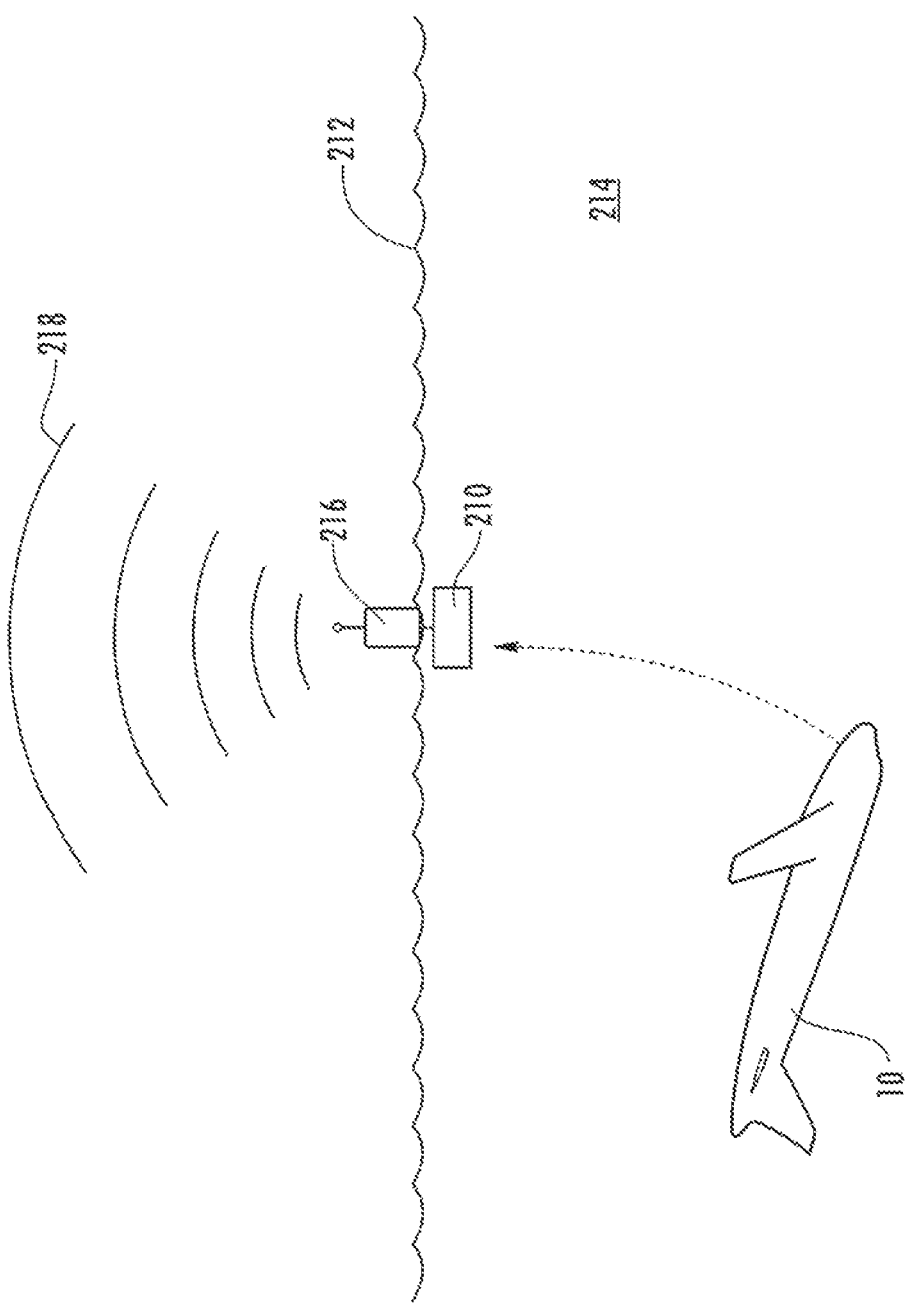

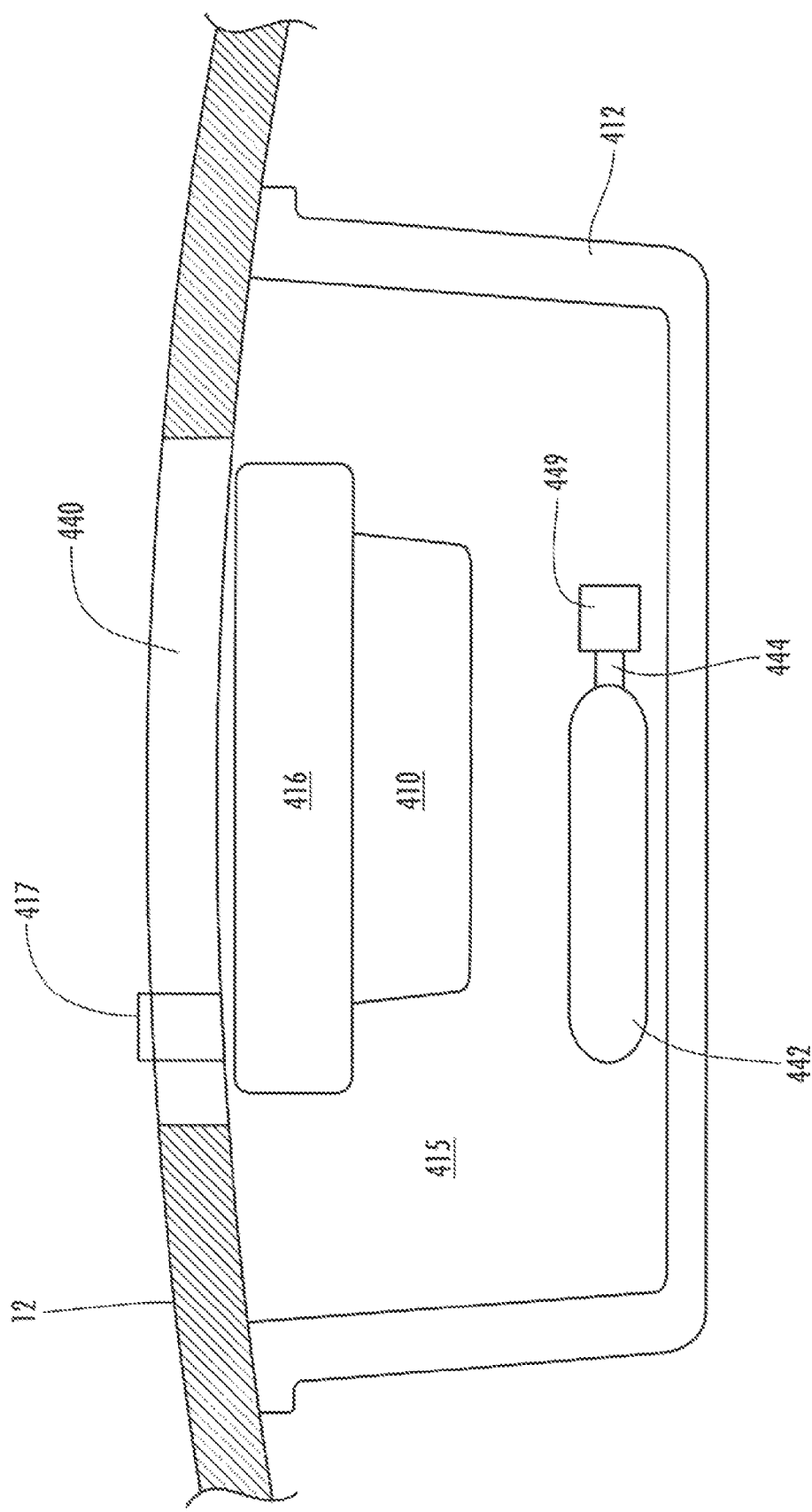

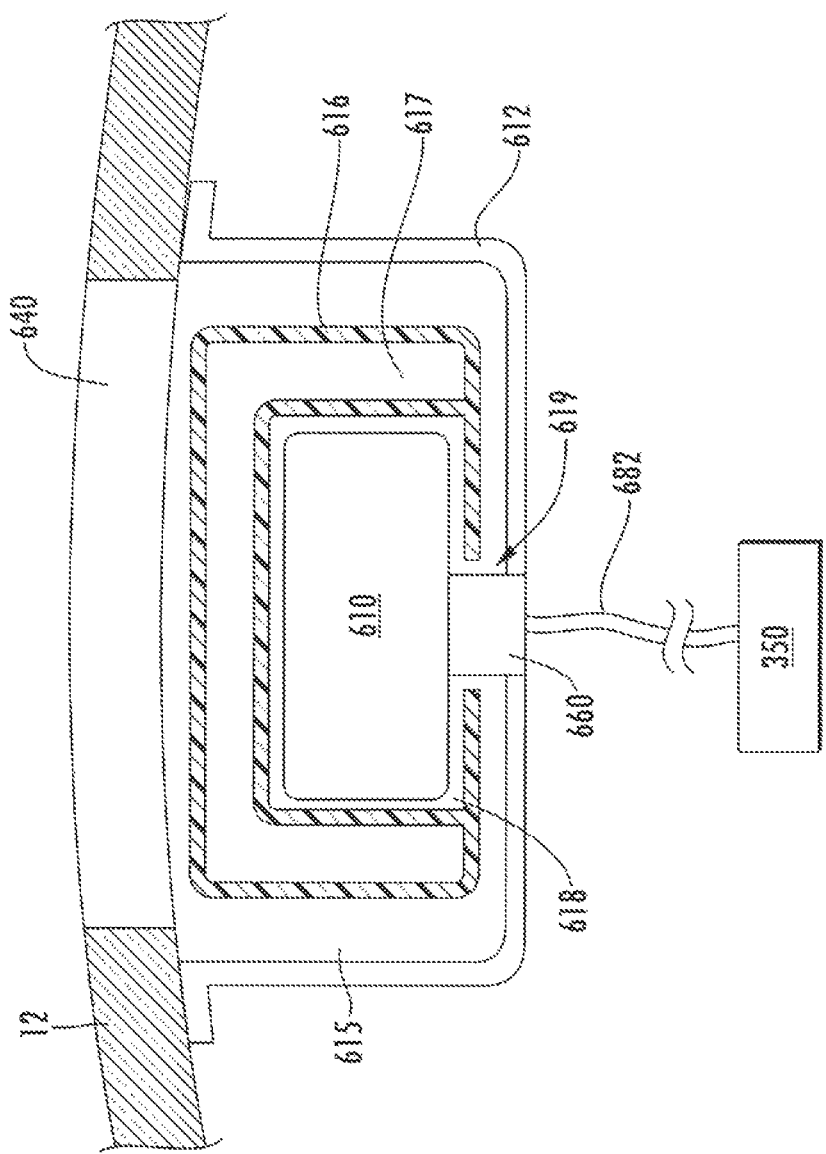

AUTOMATICALLY EJECTING FLIGHT DATA RECORDER

CROSS-REFERENCE TO RELATED APPLICATION

This application is a continuation-in-part of U.S. application Ser. No. 12/764,374 filed on Apr. 21, 2010 the contents of which are incorporated herein by reference in its entirety.

FIELD OF THE INVENTION

This disclosure generally relates to a system and method for improved retrieval of flight data recorders from air planes that crashes into or over a body of water.

BACKGROUND

Flight data recorders, also known as "black boxes", maintain data representing the state of the aircraft in which they are mounted, and are designed, configured, and manufactured to withstand periods of fire and pressure which may be associated with a crash. They also contain transponders and batteries for energizing the transponders to facilitate location of the flight data recorder.

On at least one occasion, an airliner fitted with a flight data recorder was lost, apparently in a midair breakup, over deep ocean. Use of deep-diving submarines was attempted, but the flight data recorder was not recovered within a time span during which the transponder could have been kept energized. Therefore, improved flight data recorder recovery is desired.

SUMMARY

According to an embodiment of the present disclosure an apparatus for holding a flight data recorder in an aircraft comprises a housing that defines a compartment enclosing the flight data recorder. The compartment is provided with an opening sufficiently large to allow the flight data recorder to egress from the housing. A cover is provided for closing the opening when the cover is in a closed position. The cover is held in the closed position by one or more releasable fasteners that are configured to open the cover when the one or more releasable fasteners are triggered. A flotation device is provided within the compartment and attached to the flight data recorder. When the aircraft crashes into a body of water, the one or more releasable fasteners are triggered thereby opening the cover and the means for controllably disconnecting the flight data recorder disconnects the one or more data links. The flotation device floats out of the housing and pulls the flight data recorder from the housing and floats the flight data recorder to the surface of the water. The flight data recorder can then be located by pinging the transponder provided in the flight data recorder.

In another embodiment, the flotation device has a rigid construction and comprises a cavity space for holding the flight data recorder therein and a sealed hollow interior that provides buoyancy in water.

BRIEF DESCRIPTION OF THE DRAWINGS

These and other features and advantages of the present invention will be more fully disclosed in the following detailed description of a preferred embodiment of the invention, which is to be considered together with the accompanying drawings wherein like numbers refer to like parts, and further wherein:

FIG. 1 is a simplified illustration of an aircraft, showing possible locations at which a flight data recorder may be mounted according to the present disclosure;

FIG. 3 is a simplified diagram showing an aircraft sinking in water, and also showing an ejected flight data recorder, float and transponder;

FIG. 4 is a side elevation view in cross-section of another embodiment according to the present disclosure.

FIG. 6 is a side elevation view in cross-section of another embodiment according to the present disclosure.

All drawings are schematic and are not intended to show any dimensions to scale.

DETAILED DESCRIPTION

This description of the preferred embodiments is intended to be read in connection with the accompanying drawings, which are to be considered part of the entire written description of this invention.

In FIG. 1, an aircraft 10 illustrated in simplified side elevation is shown to illustrate some possible locations where the apparatus of the present disclosure can be implemented in an aircraft. A possible first location 30 is generally at the top of the forward portion of the aircraft fuselage 12 and a possible second location 32 at the bottom side of the forward portion of the aircraft is also identified.

Figure 2A:
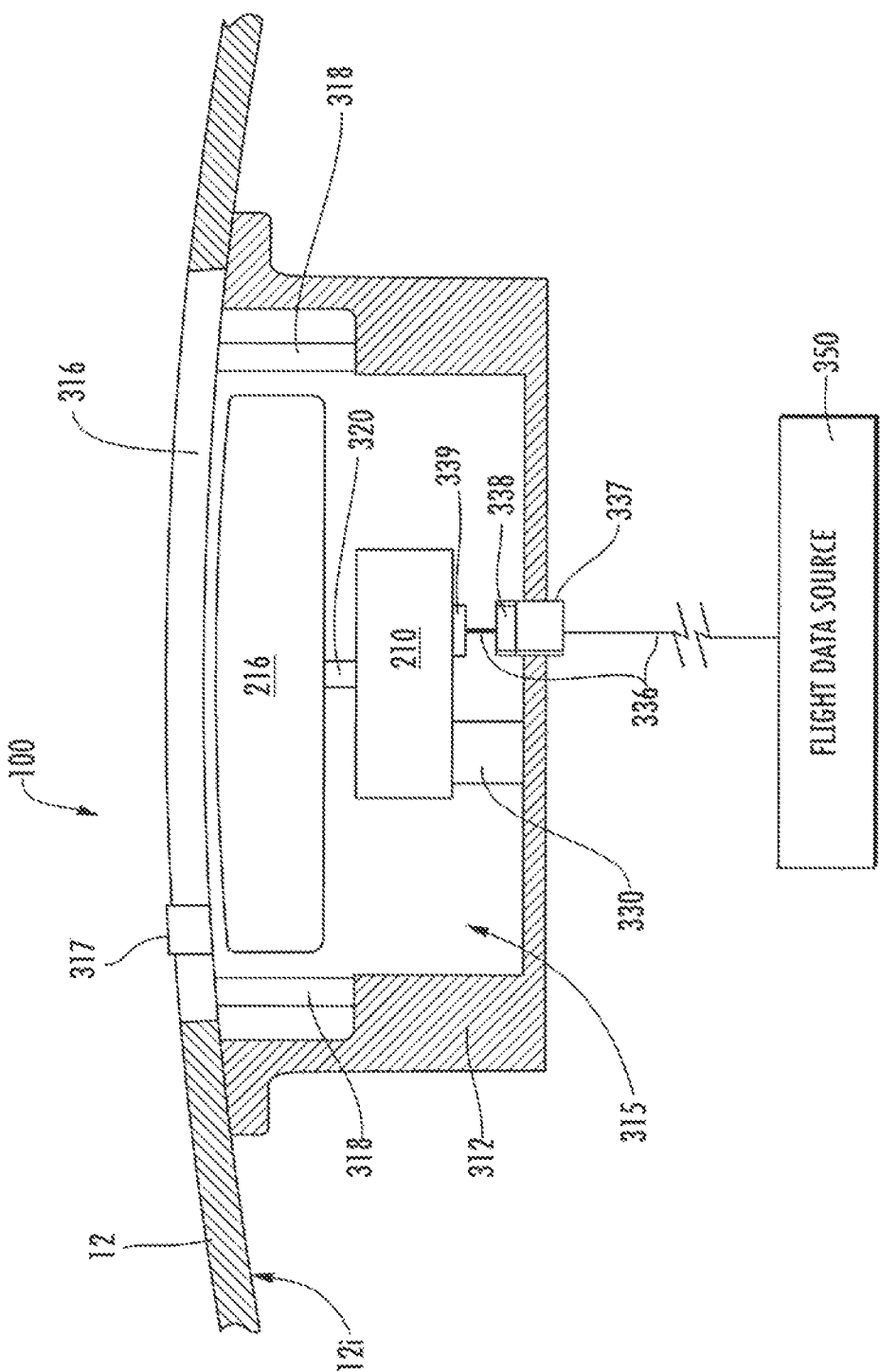
FIG. 2A is a side elevation view in cross-section of an embodiment according to the present disclosure.

FIG. 2A shows a simplified schematic cross-section of an embodiment of an arrangement 100 of an apparatus for holding a flight data recorder 210 in an aircraft according to an aspect of the present disclosure. The flight data recorder 210 is located in a compartment 315 defined by a housing 312. In one preferred embodiment, the compartment 315 is integrated into the aircraft such as the fuselage 12 and a portion of the housing 312 is formed by the aircraft's fuselage 12. An opening is provided in the compartment sufficiently large to allow the flight data recorder 210 to egress from the compartment. Preferably, the opening is provided on the portion formed by the aircraft's fuselage 12 and the opening is closed by a removable cover 316 which can be automatically opened to eject or release the flight data recorder 210 in the event of the aircraft 10 crashing over a body of water and sinks under water. Preferably, the apparatus is configured to open the cover 316 in an explosive manner to open in a fraction of a second to thereby allowing the flight data recorder 210 to be released from the sinking aircraft as the aircraft begins to sink or comes in contact with the water. This will minimize or eliminate the chance of the flight data recorder 210 sinking to the bottom of the water along with the aircraft.

The timing of the release of the flight data recorder 210 after a crash can be set to a desired amount of delay or no delay as appropriate. The arrangement 100 can be configured to release the flight data recorder 210 after an appropriate duration after a crash. This can be achieved by configuring the arrangement 100 to release or eject the flight data recorder 210 when the portion of the aircraft housing the arrangement 100 reaches certain depth under water. This can be achieved by utilizing one or more pressure sensor switches as described in more detail below.

According to one embodiment, the housing 312 is attached to the interior surface 12i of the fuselage 12 to define the compartment 315. The flight data recorder 210 and a flotation device 216, such as a flotation buoy, are normally located within the compartment 315. The flight data recorder 210 and the flotation device 216 can be attached to each other directly or by an appropriate connector 320. The flotation device 216 can be implemented in many different variety of forms. The flotation device 216 can be a balloon-like buoy and the connector 320 can be, for example, a tether or a strap. Preferably, the connector 320 is made of a material that is sufficiently strong to keep the flotation device 216 and the flight data recorder 210 attached in such environments as rough waters in an open sea during a hurricane, etc.

Depending upon the material selected for the shell of the flotation device 216, the flotation device 216 may be pre-pressurized with air to some value to prevent it from being crushed by the pressure of the water at the release depth. The flotation device 216 may be pre-pressurized in its standby state or it can be installed in a deflated state and then inflated using a pressurized gas source at the time the flight data recorder 210 is being ejected/released from the aircraft in a similar manner to the way automobile crash airbags are inflated in a crash. In another embodiment, the flotation device 216 can be a hollow vessel having a shell made of rigid material (such as rigid plastic, fiberglass, or other composite reinforced material) designed and configured to withstand a predetermined amount of water pressure so that the flotation device 216 would not be crushed even without any inflation mechanism.

The flight data recorder 210 is ejectably connected to the housing 312 by one or more ejection means 330 for forcibly ejecting the flight data recorder 210 out of the compartment 315. Because the aircraft can be sinking in the water in any orientation, the forcible ejection of the flight data recorder 210 would minimize the chance of the flight data recorder getting hung up or stuck in the compartment 315. The one or more ejection means 330 can be explosively releasing fasteners such as explosive bolts, spring-loaded release mechanism, pressurized gas loaded release mechanism, or instantaneously inflating air-bag mechanism. The ejection means 330 is configured and adapted to explosively eject the flight data recorder 210 out of the compartment 315 upon being triggered. The trigger can be provided by one or more pressure sensitive switches that sense the water pressure as the aircraft sinks in the water.

In one preferred embodiment, the compartment 315 is configured to be flooded with the ambient water to equalize the pressure inside the compartment 315 with the water pressure outside. This will enable the ejection of the flight data recorder 210 without being trapped inside the compartment 315 by the higher water pressure outside. This may be achieved by a valve 317 that keeps the pressure inside the compartment 315 equalized to the outside pressure. The valve 317 can be provided on the cover 316.

The flight data recorder 210 is generally connected to the aircraft's flight data source 350 via one or more data links 336, such as electrical wires. Generally, the flight data source 350 is the aircraft's main control system including all the sensors and detectors and processors that generate the flight data to be recorded in the flight data recorder 210. Because the data links 336 need to be readily disconnected when the flight data recorder 210 is released from the housing 312 in the event the aircraft crashes in water, a plurality of data link connectors 337, 338, 339, such as plugs and sockets, can be provided in conjunction with the data links 336 in order to make the necessary connection between the flight data recorder 210 and flight data source 350. In another embodiment, in order to facilitate the release of the flight data recorder 210, the data link 336 can be a wireless communications link. That would eliminate the need for the hardware associated with wired connection.

The removable cover 316 is preferably held in place by one or more releasable fasteners 318 that can release or detach the cover 316 at command. Meaning that when the aircraft senses or determines that the aircraft is in the water and sinking, the one or more releasable fasteners 318 can be commanded to release the cover 316 and allow the flotation device 216 to pull or carry the flight data recorder 210 out of the cavity 315 and float to the surface of the water.

Preferably, the one or more releasable fasteners 318 are of such type that can explosively release or detach the cover 316 away from the fuselage 12 to clear the way for the flotation device 216 and the flight data recorder 210 to exit the cavity 315. For example, such releasable fasteners 318 can be implemented by explosive bolt(s) that can disconnect by an electrical trigger signal. Such trigger signals are commonly delivered to the explosive bolt(s) by wires (not shown). Another example of the releasable fasteners 318 is explosive cutters often utilized in satellite applications for deploying such deployables as solar arrays. In such explosive cutters, a controlled explosion in a cylinder drives a cutting member into an anvil for cutting cables that holds the deployables.

In order to sense or determine that the aircraft is in the water and sinking, the aircraft 10 can be equipped with one or more pressure sensor switches that are calibrated to trigger the releasable fasteners 318 when the aircraft 10 reaches a predetermined depth under water. For example, the one or more pressure sensor switches can be calibrated to trigger the releasable fasteners 318 when the aircraft 10 reaches the depth of at least 20 ft. Other types of controllably detachable fasteners known to one skilled in the art can be used. The source of the trigger signals for the explosive bolts 318 will be readily understood to those skilled in the art. The source requires only a source of energy, such as a battery, and a pressure-sensitive switch.

Figure 2B:
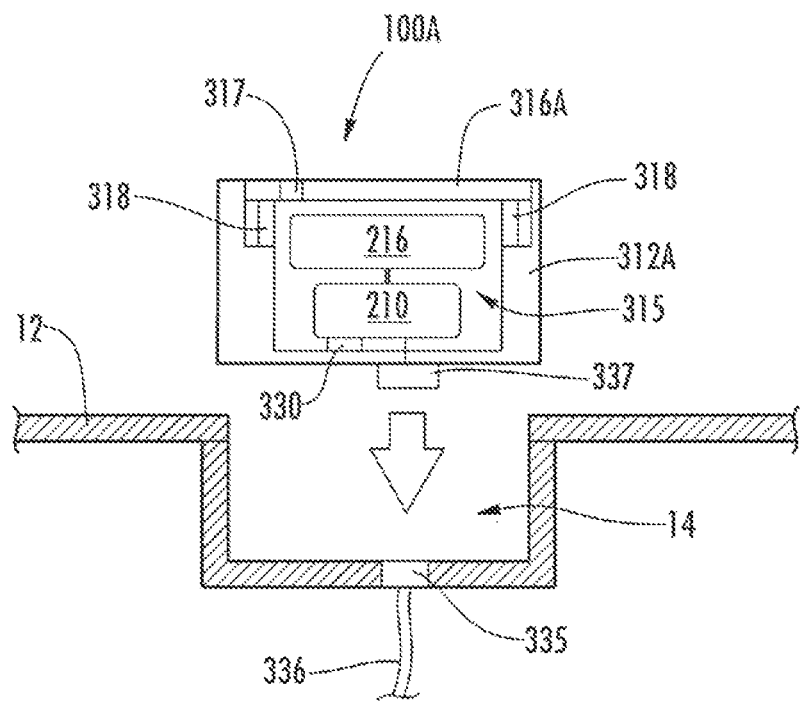
FIGS. 2B and 2C are side elevation view in cross-section of another embodiment according to the present disclosure.
Figure 2C:
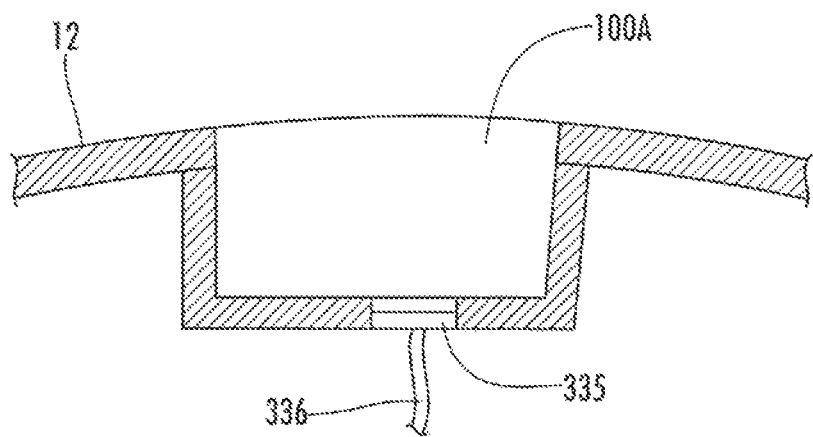

FIGS. 2B and 2C show another embodiment of the present disclosure. In this embodiment, a housing 312A that defines the compartment 315 in which the flight data recorder 210 and the flotation device 216 reside is configured to be a preassembled discrete unit 100A separate from the aircraft's fuselage 12. The discrete unit 100A is configured to be plugged into a recess 14 provided in the fuselage 12.

The internal structure and configuration of the preassembled unit 100A is same as that of the housing 312 illustrate in FIG. 2A. As shown in the cross-sectional view of the preassembled unit 100A in FIG. 2B, a cover 316A is held in place by the one or more releasable fasteners 318. The data link 336 that connects the flight data recorder 210 to the aircraft's system (the flight data source), is connected to the flight data recorder 210 via data link connectors 335 and 337. The trigger wire connection for the fasteners 318 can also be wired through the data link connectors 335 and 337 or, if necessary, they can be wired through one or more additional connectors (not shown). By providing the flight data recorder 210 pre-packaged into the preassembled unit 100A, the preassembled unit can be easily installed on the aircraft 10. This also make it simple to replace the flight data recorder 210 if it becomes necessary to replace it with a new one or repair it. FIG. 2C shows the preassembled unit 100A that has been plugged into the recess 14 provided in the fuselage 12. The deployment or ejection of the flight data recorder 210 from the preassembled unit 100A in the event of an aircraft crash into water, is effected in the same manner as described above in connection with the embodiment shown in FIG. 2A.

FIG. 3 is an illustration of a flight data recorder 210 floating near the surface 212 of a body of water 214 after being released from a sinking aircraft 10 by action of the apparatus of the present disclosure and lifted to the surface by the flotation device 216 attached to the flight data recorder 210. As discussed above, a transponder is provided either on the flight data recorder itself or the flotation device 216 and can transmit transponder signal 218 in response to a pinging signal transmitted by the rescuers. Alternatively, the flight data recorder 210 or the flotation device 216 may includes a radio-frequency beacon which transmits a homing signal continuously upon ejection/release of the flight data recorder 210 from the aircraft which identifies the flight data recorder and allows the rescuers to home in on the location of the flight data recorder 210.

Referring to FIG. 4, another embodiment of the means for ejecting or releasing a flight data recorder 410 is described. Similar to the other embodiments, a housing 412 in conjunction with the aircraft's fuselage 12 defines a compartment 415 in which the flight data recorder 410 is located. An opening is provided in the fuselage 12 providing access to the compartment 415 through which the flight data recorder 410 is ejected/released in the event of the aircraft crashing into a body of water. A removable cover 440 normally keeps the opening closed. According to another aspect of the invention, pressurized gas is used to eject the flight data recorder, with or without an associated flotation buoy. The pressurized gas can be provided from a compressed gas source.

In this embodiment, a container 442 of pressurized gas, such as air, is provided. The container 442 is provided with a frangible closure 444 and an explosive cutting device 449. The explosive cutting device 449 would operate similar to the explosive bolts discussed above to instantly break open the frangible closure 444 upon being triggered to release the contents of the high pressure fluid from the container 442 into the compartment 415. The sudden increase in the pressure within the compartment 415 explosively ejects the flight data recorder 410 through the cover 440 and out of the compartment 415. The explosive ejection of the flight data recorder 410 helps free the flight data recorder 410 from the aircraft regardless of the orientation of the aircraft in the body of water after crashing. As in the embodiment shown in FIG. 2A, a valve 417 can be provided to equalize the pressure inside the compartment 415 with the outside pressure.

A floatation device 416 attached to the flight data recorder 410 then carries the flight data recorder 410 to the surface of the water. The container 442 of pressurized fluid can be provided within the compartment 415 but is not necessary. The container 442 can be provided outside the compartment 415 but appropriately connected to the compartment 415 by appropriate plumbing to inject the pressurized fluid into the compartment 415 when desired to be able to pressurize the compartment 415 to a high enough pressure to blow out the cover 440 and eject/release the flotation device 416 and the flight data recorder 410 out of the compartment 415.

Figure 5:
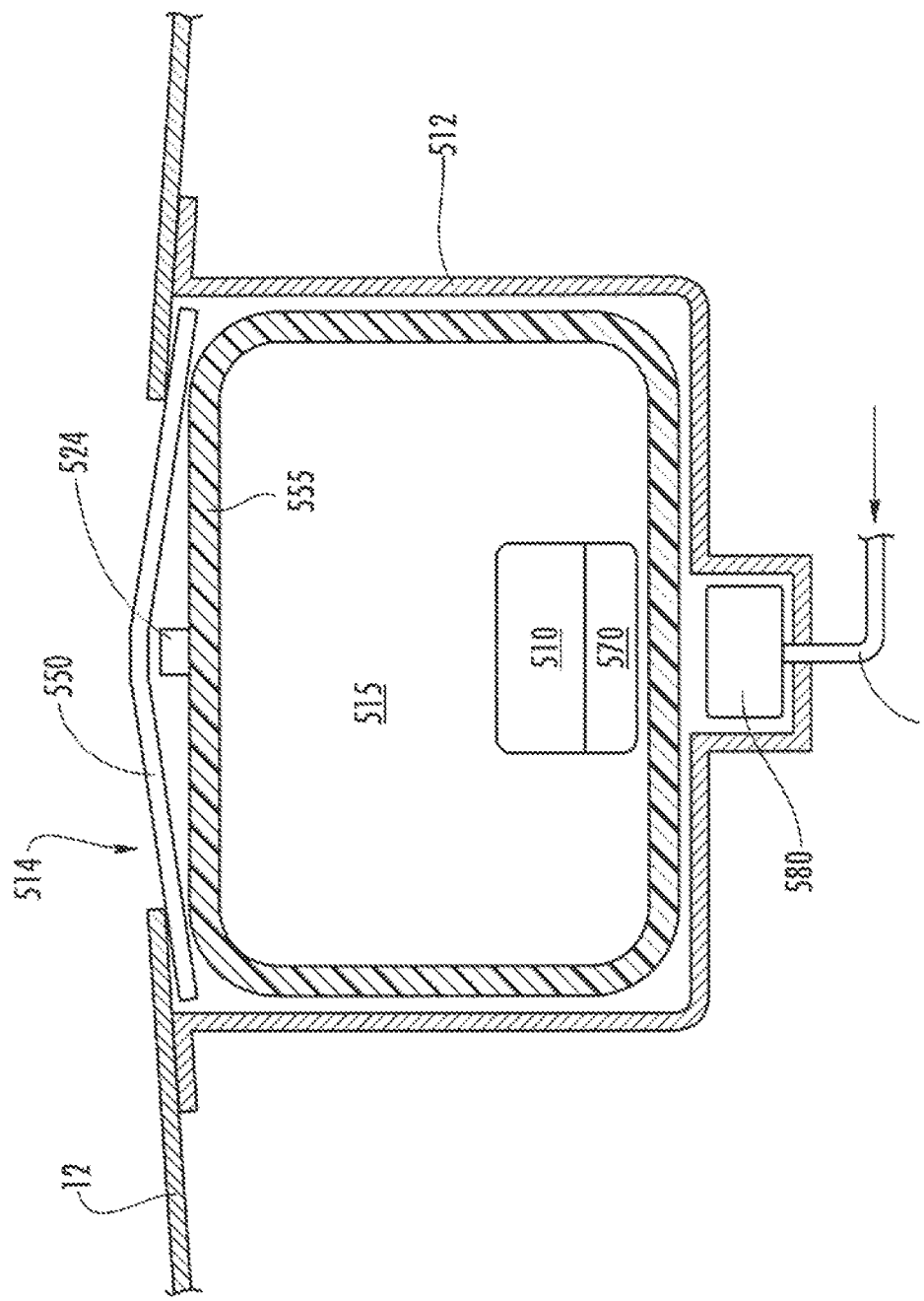
FIG. 5 is a side elevation view in cross-section of a further embodiment according to the present disclosure.

FIG. 5 illustrates another arrangement according to another aspect of the present disclosure. An aperture 514 in the fuselage 12 is closed by a flexible seal 550, which is pressed against the aperture 514 by a pressurized flotation device 555. The flotation device 555 can be a pressurized balloon. The flexible seal 550 is preferably made of a weather-resistant material for durability and to protect the flotation device 555. The pressurized flotation device 555 is constrained from expansion by the support structure 512 and presses against the flexible seal 550 and the rim of the aperture 514, thus, keeping the flexible seal 550 in place and sealed against the rim of the aperture 514. The flight data recorder 510 is attached to the flotation device 555. The flight data recorder 510 can be attached to the flotation device 555 by being contained inside the flotation device 555 as shown or by being affixed to the exterior of the flotation device 555 (not illustrated). The flotation device 555 is pressurized to a predetermined pressure to maintain certain minimum size that is too large to fit through the opening 514. Therefore, under normal flight conditions or when the aircraft is on the ground, the flotation device 555 remains constrained within the well 515. If the airplane should enter water and sink to some predetermined depth, the ambient water pressure will cause the flotation device 555 to contract. When the flotation device 555 becomes smaller than the aperture 514 it will float out and carry the flight data recorder to the surface of the water. The flexible membrane 550 will simply be carried out of the well 515 along with the flotation device 555 because the flexible membrane is not permanently attached to the rim of the aperture 514. The pressurization of the flotation device 555 can be controlled so that the flotation device 555 will deploy out of the housing at a particular desired depth. An air valve 524 can be provided on the flotation device 555 for pressurizing the device.

If the flight data recorder 510 of FIG. 5 is fitted with data link wire(s), the data link wire(s) can be allowed to be disconnected by means of an explosive bolt, as mentioned above. If the data link wire(s) is fitted with a connector and the connector is a slide-on connector, it can be allowed to come free.

In the embodiment of FIG. 5, the flight data recorder 510 is connected to the sources of data and power by a magnetically or electromagnetic coupler including a coupler 570, which interacts with a mating coupler 580. The coupler 580 receives alternating power and data from the aircraft by way of bidirectional data and power bus 582, and transduces the power to coupler 570 by magnetic induction, as is well known in the art. The data may also be transferred between the couplers 570 and 580 magnetically, or by way of light-operated couplers, also well known in the art. In this way, there is no hard-wired data link wire(s) that has to be cut or disconnected in order to free the flight data recorder 510 to leave the well 515.

As with the other embodiments described above, one or more data links for connecting the flight data recorder to the aircraft can be provided. The flight data recorder is generally connected to the aircraft's flight data source 350. The one or more data links can be implemented by hard wires or by a wireless communication link. Where the one or more data links are implemented by hard wires the arrangement of FIG. 5 can further include a means for disconnecting the flight data recorder from the one or more data links. The means for disconnecting the flight data recorder may be a compressed gas or explosive bolt(s) as described above in connection with other embodiments of the present disclosure.

Referring to FIG. 6, another embodiment of the apparatus for ejecting or releasing a flight data recorder 610 is described. Similar to the other embodiments, a housing 612 in conjunction with the aircraft's fuselage 12 defines a compartment 615 in which the flight data recorder 610 is located. An opening is provided in the fuselage 12 providing access to the compartment 615 through which the flight data recorder 610 can be ejected/released. A removable cover 640 normally keeps the opening closed but the removable cover 640 is configured to be detached from the fuselage 12 to clear the way for ejection of the flight data recorder 610 when the aircraft is being submerged in a body of water. The configuration of the attachment of the removable cover 640 to the fuselage 12 can be one of the embodiments described above that will enable such detachment.

In this embodiment, the flight data recorder 610 is encapsulated within a flotation device 616. The flotation device 616 is preferably configured to have a rigid construction and sealed hollow interior that provides the buoyancy necessary to carry the flight data recorder 610 to the surface. Preferably, the flotation device 616 can be made from rigid plastic (e.g. PET) and is configured with a double walled structure so that it has a sealed hollow interior 617 that provides the necessary buoyancy. The rigid construction of the flotation device 616 allows it to maintain the hollow interior configuration without collapsing under ambient water pressure. Thus, the sealed hollow interior 617 of the flotation device 616 does not need to be pressurized. The rigid construction of the flotation device 616 is such that the flotation device does not collapse under ambient water pressure at depth of up to 200 ft. The flotation device 616 preferably has a cavity space 618 for receiving the flight data recorder 610. The cavity space 618 is just large enough to hold the flight data recorder 610 snugly. The rigid construction of the flotation device 616 protects the flight data recorder 610 from possible physical damage. The cavity space 618 can also be lined with shock absorbing material (e.g. elastomers, foam, etc., (not shown)) that can provide further physical protection to the flight data recorder 610 and also help snugly holding the flight data recorder 610.

Because of the buoyancy of the flotation device 616, once the removable cover 640 is opened or detached from the fuselage 12 after the aircraft submerges under water, the sudden increase in the ambient water pressure within the compartment 615 results in the flotation device 616, including the flight data recorder 610 encapsulated therein, to explosively ejected out of the compartment 615. The explosive ejection of the flotation device 616 helps free the flight data recorder 610 from the aircraft regardless of the orientation of the aircraft in the body of water after crashing.

The flight data recorder 610 can be connected to the flight data source 350 by any appropriate means known in the art, some of which are described in conjunction with the other disclosed embodiments. For example, the connection can be enabled by one or more data links 682 similar to the data links 336 of FIG. 2B.

The connection between the one or more data links 682 and the flight data recorder is made by a connection means 660 that readily disconnects when the flight data recorder 610 is being pulled out of the fuselage 12 by the flotation device 616. The connection means 660 can be enabled by hard-wire connection formed by one or more connectors, similar to the data link connectors 335, 337 shown in the embodiment illustrated in FIG. 2B. The connection means 660 can also be enabled by a wireless connection, similar to the wireless data/power couplers 570, 580 shown in the embodiment illustrated in FIG. 5.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An apparatus for holding a flight data recorder in an aircraft comprising:
   a housing for enclosing the flight data recorder, the housing provided with an opening for the flight data recorder to egress from the housing;
   a cover for closing the opening when the cover is in a closed position;
   one or more releasable fasteners holding the cover in the closed position and configured to open the cover when the one or more releasable fasteners are triggered; and
   a flotation device provided within the housing for carrying the flight data recorder out of the housing, wherein the flotation device has a rigid construction and comprises:
   a first compartment defining a first cavity space for holding the flight data recorder therein; and a second compartment separate from said first compartment and defining an unoccupied, sealed interior cavity space that provides buoyancy in water.

2. The apparatus of claim 1, wherein the one or more first releasable fasteners are explosive bolts that are triggered by an electrical trigger signal.

3. The apparatus of claim 1, wherein the cover is hingeably attached to the housing on one side thereof by a biased hinge and the one or more first releasable fasteners are provided on the opposite side thereof for holding the cover in closed position until the one or more releasable fasteners are triggered.

4. The apparatus of claim 1, further comprising one or more data links for connecting the flight data recorder to the aircraft.

5. The apparatus of claim 4, further comprising a means for disconnecting the flight data recorder from the one or more data links.

6. The apparatus of claim 5, wherein the means for disconnecting the flight data recorder is a compressed gas.

7. The apparatus of claim 5, wherein the means for disconnecting the flight data recorder from the one or more data links is a second releasable fastener.

8. The apparatus of claim 7, wherein the second releasable fastener is an explosive bolt that is triggered by an electrical trigger signal.

9. The apparatus of claim 1, wherein the housing is integrated into the aircraft's fuselage.

10. The apparatus of claim 9, wherein a portion of the housing is formed by the aircraft's fuselage.

11. The apparatus of claim 1, wherein the second compartment at least partially surrounds the first compartment.

12. The apparatus of claim 1, wherein the floatation device comprises:
    an inner wall; and
    an outer wall surrounding the inner wall;
    wherein the inner wall defines at least a portion of the first cavity space of the first compartment; and
    wherein the inner wall and the outer wall define the sealed interior cavity space therebetween.

13. The apparatus of claim 12, wherein the inner wall and outer wall are configured as a rigid plastic.

14. The apparatus of claim 12, wherein the inner wall and the outer wall defining the sealed interior cavity space delineate a continuous, uninterrupted border for sealing the interior cavity space.

15. The apparatus of claim 1, wherein the first cavity space comprises a generally rectangular cavity space, and wherein the unoccupied, sealed interior cavity space surrounds the first cavity space on at least three sides thereof.

16. The apparatus of claim 1, wherein the first cavity space is defined by first, second and third interior walls, and a first exterior wall, and wherein the unoccupied, sealed interior cavity space is defined by the first exterior wall and second, third and fourth exterior walls, and the first, second and third interior walls such that the first cavity space is arranged within an area defined by the first, second, third and fourth exterior walls.

* * * * *